(12) United States Patent
Sakai et al.

(10) Patent No.: US 12,138,898 B2
(45) Date of Patent: Nov. 12, 2024

(54) SOLAR CELL MODULE RECYCLING METHOD AND RECYCLING DEVICE

(71) Applicant: SOLAR FRONTIER K.K., Tokyo (JP)

(72) Inventors: Noriyuki Sakai, Tokyo (JP); Hideki Harada, Tokyo (JP)

(73) Assignee: SOLAR FRONTIER K.K., Tokyo (JP)

( * ) Notice: Subject to any disclaimer, the term of this patent is extended or adjusted under 35 U.S.C. 154(b) by 1025 days.

(21) Appl. No.: 17/048,087

(22) PCT Filed: Apr. 5, 2019

(86) PCT No.: PCT/JP2019/015123
§ 371 (c)(1),
(2) Date: Oct. 15, 2020

(87) PCT Pub. No.: WO2019/203026
PCT Pub. Date: Oct. 24, 2019

(65) Prior Publication Data
US 2021/0162729 A1    Jun. 3, 2021

(30) Foreign Application Priority Data

Apr. 19, 2018    (JP) ................................ 2018-080716

(51) Int. Cl.
*B32B 43/00*    (2006.01)
*B09B 3/40*    (2022.01)
(Continued)

(52) U.S. Cl.
CPC .............. *B32B 43/006* (2013.01); *B09B 3/40* (2022.01); *H01L 31/048* (2013.01); *H01L 31/186* (2013.01); *B32B 2457/12* (2013.01)

(58) Field of Classification Search
CPC ........................... B32B 43/006; B09B 3/0083
See application file for complete search history.

(56) References Cited

U.S. PATENT DOCUMENTS

2006/0131260 A1    6/2006    Okuyama et al.
2013/0048224 A1*    2/2013    George ............... B32B 38/1858
                                                                                                                                            156/752
(Continued)

FOREIGN PATENT DOCUMENTS

CN            112058871 A      12/2020
JP            2004-186547 A     7/2004
(Continued)

OTHER PUBLICATIONS

Machine translation JP2011173099A (Year: 2004).*
(Continued)

*Primary Examiner* — Jacob T Minskey
*Assistant Examiner* — Wayne K. Swier
(74) *Attorney, Agent, or Firm* — Foley & Lardner LLP

(57) ABSTRACT

A recycling method is applied to a solar cell module which includes a cover glass, an electric cell layer, and a sealing material which closely adheres the cover glass and the electric cell layer. The recycling method includes heating an interface between the cover glass and the sealing material to a prescribed temperature range; and applying a force from a side surface of the solar cell module to the sealing material with the interface maintained at the prescribed temperature range, to peel off the sealing material and the electric cell layer from the interface thereof.

13 Claims, 13 Drawing Sheets

(51) Int. Cl.
*H01L 31/048* (2014.01)
*H01L 31/18* (2006.01)

(56) References Cited

U.S. PATENT DOCUMENTS

| | | | |
|---|---|---|---|
| 2018/0178492 A1 | | 6/2018 | Nagao et al. |
| 2018/0254364 A1* | | 9/2018 | Kawanishi ............ B09B 5/00 |
| 2020/0247106 A1 | | 8/2020 | Lee et al. |

FOREIGN PATENT DOCUMENTS

| | | | | |
|---|---|---|---|---|
| JP | 2011-173099 | A | | 9/2011 |
| JP | 2012019134 | A | * | 1/2012 |
| JP | 2014104406 | A | * | 6/2014 |
| JP | 5574750 | B2 | | 8/2014 |
| JP | 2014-079667 | A | | 5/2015 |
| JP | 2015-110201 | A | | 6/2015 |
| JP | 2016-203061 | A | | 12/2016 |
| WO | WO-2013/063603 | A2 | | 5/2013 |
| WO | WO-2017/127489 | A1 | | 7/2017 |
| WO | WO-2018/137735 | A1 | | 8/2018 |

OTHER PUBLICATIONS

Colortrac CIS (Contact Image Sensor) (May 4, 2012). https://web.archive.org/web/20120504095512/https://www.colortrac.com/glossary/cis-contact-image-sensor/ (Year: 2012).*
Machine translation JP2012019134A (Year: 2012).*
Machine translation JP2016203061A (Year: 2016).*
Princy A.J. Ethylene Vinyl Acetate resins: Properties, Advantages, Applications, and Their Recyclability from Research Dive Jul. 25, 2022 (Year: 2022).*
Machine translation JP2014104406A (Year: 2014).*
International Searching Authority, "International Search Report," issued in connection with International Patent Application No. PCT/JP2019/015123, dated Jul. 9, 2019.
International Searching Authority, "Written Opinion," issued in connection with International Patent Application No. PCT/JP2019/015123, dated Jul. 9, 2019.
Extended European Search Report issued in connection with EP Appl. Ser. No. 19788956.1 dated Dec. 10, 2021 (9 pages).
First Chinese Office Action issued in connection with CN Appl. Ser. No. 201980026466.X dated May 11, 2022 (12 pages).

* cited by examiner

SOLAR CELL MODULE RECYCLING METHOD AND RECYCLING DEVICE

RELATED APPLICATIONS

The present application claims priority under 37 U.S.C. § 371 to International Patent Application No. PCT/JP2019/015123, filed Apr. 5, 2019, which claims priority to and the benefit of Japanese Patent Application No. 2018-080716, filed on Apr. 19, 2018. The contents of these applications are hereby incorporated by reference in their entireties.

TECHNICAL FIELD

The present invention relates to a solar cell module recycling method and recycling device.

BACKGROUND ART

Solar photovoltaic power generation is attracting attention regarding electric power generation using renewable energy. Along with this, it is expected that a large number of solar cell modules will be installed in various places in the future. Therefore, mechanisms or technologies for recycling solar cell modules which have been used is attracting attention.

An important point in recycling a solar cell module is a method for realizing recycling at low cost and a method for collecting a material in high yield. Reducing the cost of recycling may include shortening a cost payback time and allowing the recycling cost to be included in a selling price of a product. Furthermore, solar cell modules include various materials including rare metals and harmful substances. Therefore, if these materials can be collected in high yield, it can contribute to effective utilization of global resources, reduction of product costs, and harmful substances not being dispersed.

Citation List

Patent Literature

[Patent Literature 1]
 Japanese Patent Laid-open No. 2016-203061
[Patent Literature 2]
 Japanese Patent No. 5574750

SUMMARY OF INVENTION

Technical Problem

Patent Literature 1 describes a technique for separating a glass substrate from other materials using a blade (a edged tool) in recycling a solar cell module. However, the separation of the glass substrate and the other materials is performed by cutting a sealing material which closely adheres these with the blade. In this case, after the separation, a large amount of sealing material remains closely adhered onto the glass substrate. Therefore, in the technique for Patent Literature 1, a step of removing the sealing material remaining above the glass substrate is required. This step is, for example, a step of firing the sealing material at a high temperature for about 13 hours and performing thermal decomposition, thereby significantly increasing the recycling cost and increasing the environmental load due to the generation of $CO_2$.

Also, Patent Literature 2 describes a technique for pressing a blade against a sealing material which has been softened through heating and separating a back surface protective material from a glass substrate. However, also in this technique, the sealing material which closely adheres the glass substrate and the back surface protective material is cut using the blade. In this case, as in the technique described in Patent Literature 1, after the separation, a large amount of sealing material remains closely adhered onto the glass substrate. Therefore, also in the technique described in Patent Literature 2, in order to remove the sealing material remaining above the glass substrate, for example, a step of firing the sealing material at a high temperature for a long time and performing thermal decomposition is required.

Embodiments of the present invention propose a technique for recycling a solar cell module in which a material is able to be collected at low cost and high yield.

A recycling method according to an embodiment of the present invention is applied to a solar cell module which includes a cover glass, an electric cell layer, and a sealing material which closely adheres these. The recycling method includes heating an interface between the cover glass and the sealing material to a prescribed temperature range; and applying a force from a side surface of the solar cell module to the sealing material with the interface maintained at the prescribed temperature range, to peel off the sealing material and the electric cell layer from the interface thereof.

Advantageous Effects of Invention

According to an embodiment of the present invention, it is possible to realize a technique for recycling a solar cell module in which a material is able to be collected at low cost and high yield.

DESCRIPTION OF EMBODIMENTS

Figure 1:
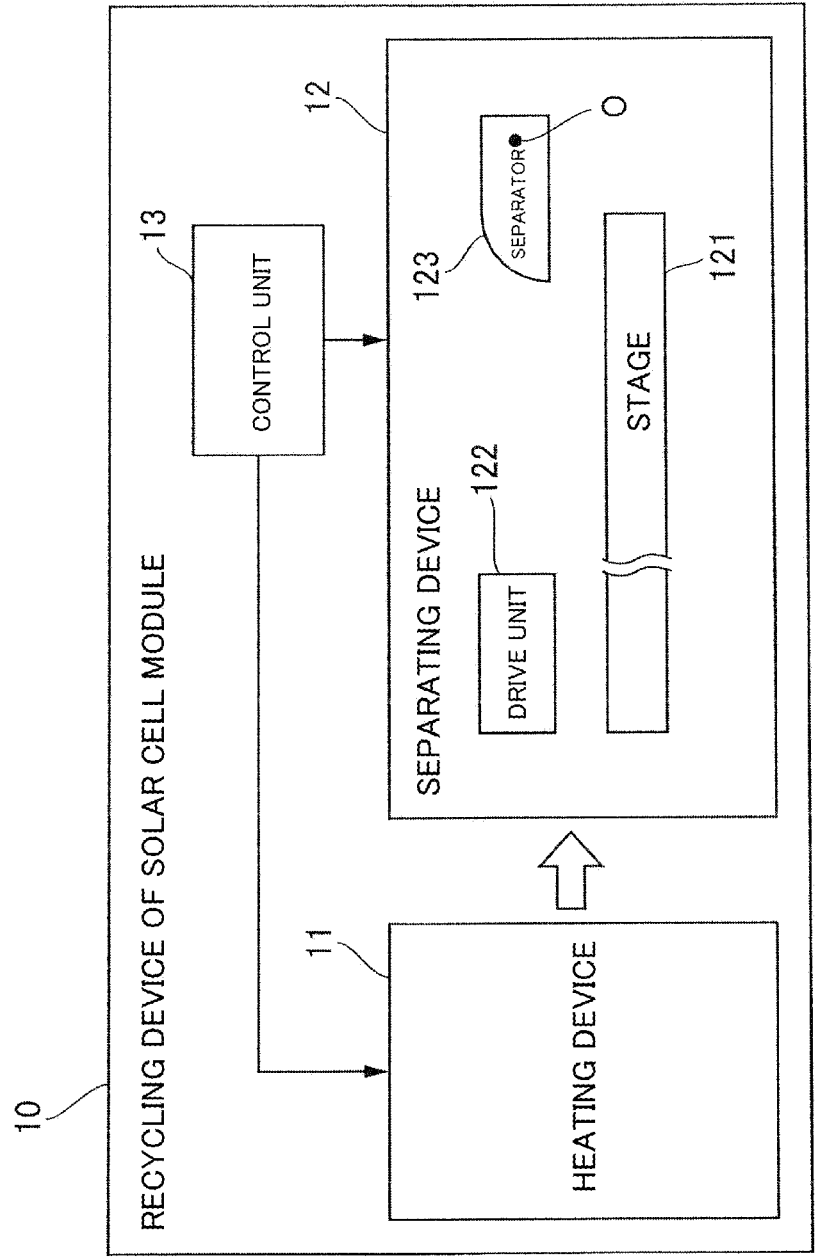
FIG. 1 is a diagram illustrating a first example of a recycling device.

Embodiments will be described below with reference to the drawings.

In the embodiments, in order to facilitate the understanding of the description thereof, the description of structures or constituent element other than a main part of the present invention will be provided in a simplified or omitted manner. Furthermore, in the drawings, the same constituent elements will be denoted by the same reference symbols. In the drawings, thicknesses, shapes, and the like of each of constituent elements are shown schematically and do not show the actual thicknesses or shapes.

<Recycling Device of Solar Cell Module>

First, an example of a recycling device of a solar cell module will be described.

FIG. 1 illustrates a first example of the recycling device.

A recycling device 10 in the solar cell module includes a heating device 11, a separating device 12, and a control unit 13 configured to control these.

The heating device (a heater) 11 heats the solar cell module to be recycled to a prescribed temperature range. For example, when the solar cell module including a cover glass, an electric cell layer, and a sealing material which closely adheres these is provided, as will be described later, the heating device 11 is provided for the purpose of heating an interface between the cover glass and the sealing material to a prescribed temperature range. As will be described later, this is for peeling off the sealing material from the cover glass together with the electric cell layer.

Therefore, although it is desirable that the heating device 11 have a function in which the interface between the cover glass and the sealing material can be locally heated, the heating device 11 may heat the entire solar cell module since in this case, it is possible to peel off the sealing material from the cover glass together with the electric cell layer by heating the solar cell module to the prescribed temperature range and applying a force to the sealing material from a side surface thereof.

For this reason, a type of heating device 11 is not particularly limited. A lamp heating type, a resistance heating type, a high frequency heating type, an induction heating type, or the like can be used for the heating device 11.

The separating device 12 has a function of peeling off the sealing material and the electric cell layer from the cover glass without performing cutting of the sealing material on the solar cell module which has been heated to the prescribed temperature range using the heating device 11. The separating device 12 includes a stage 121, a drive unit 122, and a separator 123. The stage 121 is for installing or transporting the solar cell module. The drive unit 122 sets a relative speed between the solar cell module and the separator 123 to a prescribed speed range in a direction parallel to a surface of the cover glass or the stage 121 and presses the side surface of the solar cell module against the separator. For example, the drive unit 122 sends out the solar cell module above the stage 121 in a direction in which the solar cell module is directed to the separator 123 in a prescribed speed range.

The separator 123 applies a force from the side surface of the solar cell module to the sealing material. A shape of the separator 123, a state concerning whether the separator 123 is fixed or movable, or the like is not limited as long as it can apply a force to the sealing material. For example, in FIG. 1, the separator 123 has a curved surface portion. This curved surface portion is effective for effectively converting a force to be applied to the side surface of the solar cell module into a force for peeling off the sealing material and the electric cell layer from the cover glass, that is, a force perpendicular to the surface of the cover glass. Furthermore, the separator 123 may be fixed or may be movable in a direction parallel to the surface of the cover glass, specifically, in a direction toward the solar cell module.

The control unit 13 includes a controller and a memory. The controller is, for example, a central processing unit (CPU), a micro-pressing unit (MPU), or the like. The memory is, for example, a random access memory (RAM), a read only memory (ROM), or the like. The control unit 13 may be a unit incorporated in the recycling device 10 or a general-purpose device such as a personal computer may be utilized for the control unit 13.

The control unit 13 controls, for example, a prescribed temperature range in which the solar cell module is heated in the heating device 11 and a prescribed speed range in which the separating device 12 causes the solar cell module to be transferred to peel off the sealing material from the cover glass together with the electric cell layer. For example, the control unit 13 sets the prescribed temperature range to 40° C. or higher and 140° C. or lower. Furthermore, the control unit 13 sets the prescribed speed ranges to 24 mm/second or less (here, excluding 0 mm/second). The basis for setting these temperature range and the speed ranges will be described later.

When an angle of the separator 123 (corresponding to a contact angle of the separator which will be described later) can be changed about a rotation axis O and a temperature of the separator 123 can be changed, the control unit 13 may control at least one of the angle and the temperature of the separator 123. For example, the control unit 13 can control the above-described force for peeling off the sealing material and the electric cell layer from the cover glass by controlling the angle of the separator 123.

According to such a recycling device, it is possible to peel off the sealing material and the electric cell layer from the interface between the cover glass and the sealing material by performing the recycling method which will be described later. That is to say, when the solar cell module is recycled, the cover glass is not crushed and hardly any of the sealing material is left above the cover glass. Therefore, it is possible to effectively recycle a glass material and to utilize the cover glass again as it is.

Figure 2:
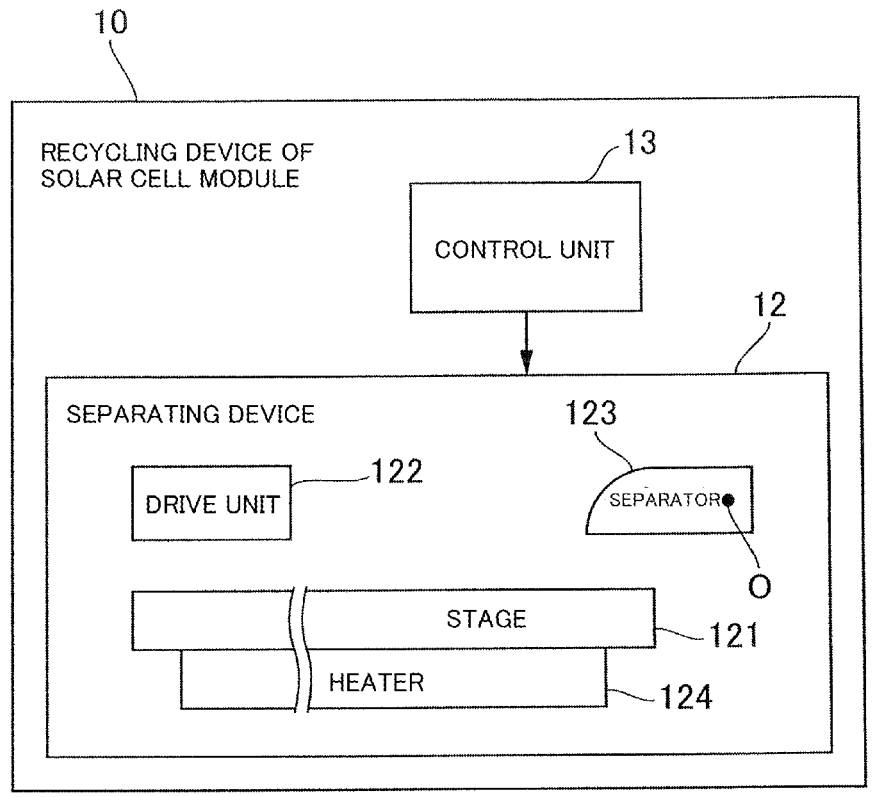
FIG. 2 is a diagram illustrating a second example of the recycling device.

FIG. 2 illustrates a second example of the recycling device.

If the recycling device 10 in this example is compared with that in the first example, the recycling device 10 in this example is characterized in that a heating device is omitted and a heater 124 is provided in a separating device 12. Since the other points are the same as those in the first example, the same reference symbols as those used in FIG. 1 are also used in FIG. 2 and thus detailed description thereof will be omitted.

The heater 124 is arranged immediately below the stage 121. The heater 124 may be incorporated inside the stage 121. Although a type of heater 124 is not particularly limited, it is desirable to utilize a resistance heating type in which a size of a device can be reduced such as, for example, a hot plate.

When the solar cell module to be recycled is arranged above the stage 121 with the cover glass side facing downward, the heater 124 can heat the solar cell module from the cover glass side. That is to say, the control unit 13 can easily set the interface between the cover glass and the sealing material of the solar cell module to a prescribed temperature range.

Therefore, if the recycling device in this example is used, it is possible to easily weaken an adhesive force at the interface between the cover glass and the sealing material. As a result, when the recycling method which will be described later is performed, it is possible to peel off the sealing material and the electric cell layer from the interface between the cover glass and the sealing material.

Figure 3:
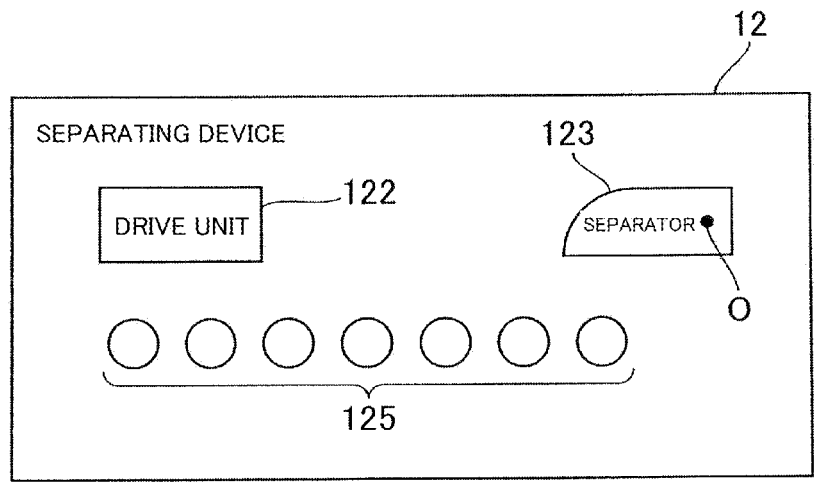
FIG. 3 is a diagram illustrating a modified example of a separating device.

FIG. 3 illustrates a modified example of the separating device.

This modified example is applicable to both of the first example (FIG. 1) and the second example (FIG. 2).

This modified example is characterized in that rollers 125 are provided instead of the stage 121 in FIGS. 1 and 2. The rollers 125 have an effect of facilitating the transportation of a solar cell module using a drive unit 122. Furthermore, when this modified example is applied to the second example, it is also possible to increase the heating efficiency of the solar cell module by providing each heater 124 in FIG. 2 between the rollers 125 in FIG. 3.

<Solar Cell Module>

An example of a solar cell module will be described below.

A type of solar cell module which can be a target in this embodiment is not particularly limited. The solar cell module to be recycled may include at least a cover glass, an electric cell layer, and a sealing material which closely adheres these.

As an example of the solar cell module which can be a target in this embodiment, two modules, i.e., a compound-based solar cell module and a silicon-based solar cell module will be described below.

Figure 4:
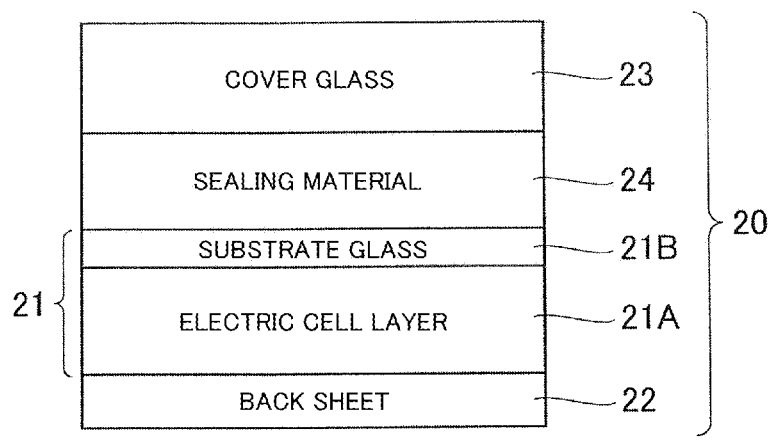
FIG. 4 is a diagram illustrating a first example of a solar cell module.

FIG. 4 illustrates a first example of the solar cell module.

The first example is an example of the compound-based solar cell module. The compound-based solar cell module is characterized in that a thickness and manufacturing cost of the solar cell module can be reduced as compared with the silicon-based solar cell module.

A solar cell module 20 includes an electric cell section 21, a back sheet 22, a cover glass 23, and a sealing material 24. The electric cell section 21 includes a substrate glass 21A and an electric cell layer 21B above the substrate glass 21A. That is to say, the solar cell module 20 has a structure in which the electric cell layer 21B is arranged between two glass plates (the cover glass 23 and the substrate glass 21A).

Here, the substrate glass 21A can be changed to a resin substrate, a metal substrate, a flexible substrate having flexibility, a flexible substrate having, for example, a stacked structure of stainless steel (SUS), aluminum, and aluminum oxide, or the like. Furthermore, the substrate glass 21A may include an alkali metal such as sodium and potassium.

The electric cell layer 21B has a function for converting light into electricity. The light is incident on the electric cell layer 21B from the cover glass 23 side. The electric cell layer 21B has, for example, the structure shown in FIG. 5.

Figure 5:
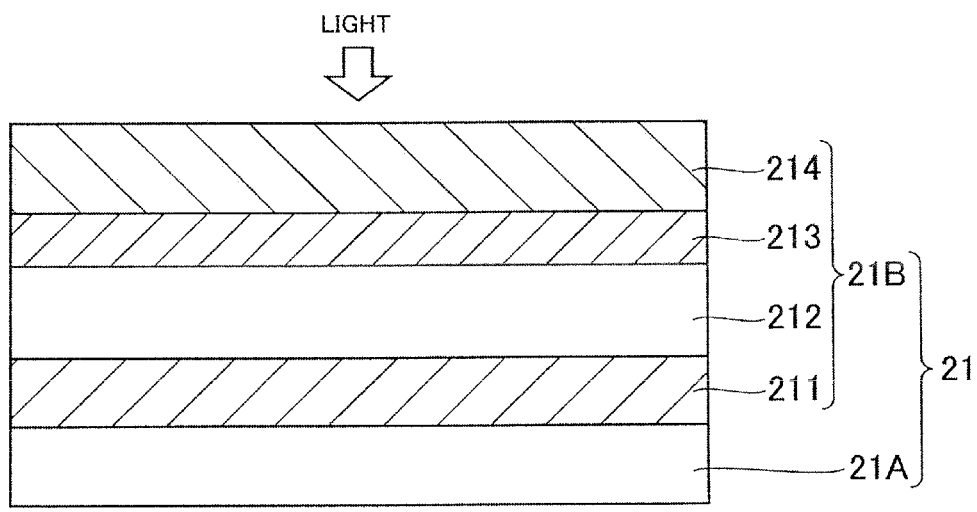
FIG. 5 is a diagram illustrating an example of an electric cell layer.

In FIG. 5, the electric cell layer 21B includes a first electrode layer 211 above the substrate glass 21A, a photoelectric conversion layer 212 above the first electrode layer 211, a buffer layer 213 above the photoelectric conversion layer 212, and a second electrode layer 214 above the buffer layer 213.

The first electrode layer 211 is, for example, a metal electrode layer. It is desirable that the first electrode layer 211 include a material which does not easily react with the photoelectric conversion layer 212. The first electrode layer 211 can be selected from molybdenum (Mo), titanium (Ti), chromium (Cr), and the like. The first electrode layer 211 may include the same material as a material included in the second electrode layer 214. A thickness of the first electrode layer 211 is set to 200 nm or more and 500 nm or less.

The photoelectric conversion layer 212 is a polycrystalline or micro-crystalline p-type compound semiconductor layer. For example, the photoelectric conversion layer 212 includes a chalcopyrite structure mixed crystal compound (I-III-(Se, S)$_2$) which includes selenium (Se) and sulfur (S) as Group VI elements (a chalcogen element), and a Group I element, and a Group III element. The Group I element can be selected from copper (Cu), silver (Ag), gold (Au), and the like. The Group III element can be selected from indium (In), gallium (Ga), aluminum (Al), and the like. Furthermore, the photoelectric conversion layer 212 may include tellurium (Te) or the like as a Group VI element, in addition to selenium and sulfur. A film thickness of the photoelectric conversion layer 212 is reduced and a thickness thereof is set to 1 μm or more and 1.5 μm or less.

The buffer layer 213 is, for example, an n-type or i (intrinsic)-type high resistance conductive layer. The expression "high resistance" mentioned herein means that the layer has a resistance value higher than a resistance value of the second electrode layer 214. The buffer layer 213 can be selected from compounds including zinc (Zn), cadmium (Cd), and indium (In). Examples of the compound including zinc include, for example, ZnO, ZnS, Zn(OH)$_2$, Zn (O, S) or Zn (O, S, OH) which is a mixed crystal thereof, ZnMgO, ZnSnO, and the like. Examples of the compound including cadmium include, for example, CdS, CdO, or Cd (O, S) or Cd (O, S, OH) which is a mixed crystal thereof. Examples of the compound including indium include, for example, InS, InO, or In(O, S) or In(O, S, OH) which is a mixed crystal thereof. Furthermore, the buffer layer 213 may have a stacked structure of these compounds. A thickness of the buffer layer 213 is set to 10 nm or more and 100 nm or less.

Although the buffer layer 213 has an effect of improving characteristics such as a photoelectric conversion rate, the buffer layer 213 can be omitted. When the buffer layer 213 is omitted, the second electrode layer 214 is arranged above the photoelectric conversion layer 212.

The second electrode layer 214 is, for example, an n-type conductive layer. It is desirable that the second electrode layer 214 include, for example, a material having a wide band gap width and a sufficiently low resistance value. Furthermore, since the second electrode layer 214 serves as a path through which light such as sunlight passes, it is desirable that the second electrode layer 214 have a property in which light having a wavelength which can be absorbed by the photoelectric conversion layer 212 is transmitted through the second electrode layer 214. From this meaning, the second electrode layer 214 is referred to as a "transparent electrode layer or a window layer."

The second electrode layer 214 includes, for example, a metal oxide to which a Group III element (B, Al, Ga, or In) is added as a dopant. Examples of the metal oxide include ZnO or SnO$_2$. The second electrode layer 214 can be selected from, for example, indium tin oxide (ITO), indium titanium oxide (ITiO), indium zinc oxide (IZO), zinc tin oxide (ZTO), fluorine-doped tin oxide (FTO), gallium-doped zinc oxide (GZO), and the like. A thickness of the second electrode layer 214 is set to 0.5 μm or more and 2.5 μm or less.

A description will be provided with reference to FIG. 4 again.

The back sheet 22 covers a back surface of the substrate glass 21A. Here, the back surface of the substrate glass 21A is a surface of two surfaces of the substrate glass 21A opposite to a surface thereof on which the electric cell layer 21B is provided. The back sheet 22 includes, for example, polyethylene terephthalate (PET), a metal foil (for example, an aluminum foil), or the like.

The sealing material 24 is arranged between the electric cell layer 21B and the cover glass 23. The cover glass 23 is, for example, white tempered glass, a transparent resin plate, or the like. The sealing material 24 includes, for example, a material such as ethylene vinyl acetate (EVA), poly vinyl butyral (PVB), and a silicone resin. The sealing material 24 seals the electric cell layer 21B and closely adheres the electric cell layer 21B and the cover glass 23 through pressing and heating.

Figure 6:
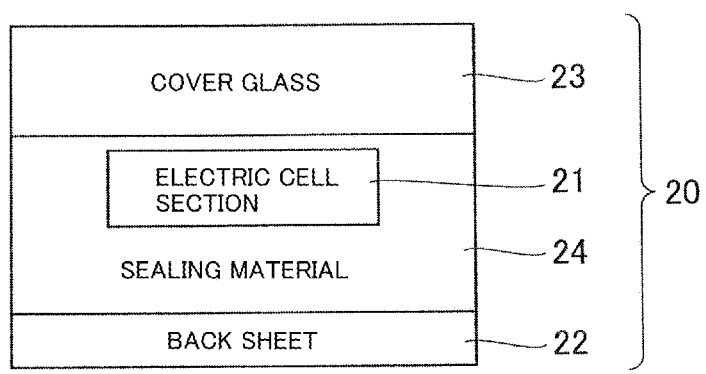
FIG. 6 is a diagram illustrating a second example of the solar cell module.

FIG. 6 illustrates a second example of the solar cell module.

The second example is an example of a silicon-based solar cell module.

A solar cell module 20 includes an electric cell section 21, a back sheet 22, a cover glass 23, and a sealing material 24 configured to seal the electric cell section 21. The sealing material 24 closely adheres the back sheet 22 and the cover glass 23. That is to say, the electric cell section 21 is arranged between the back sheet 22 and the cover glass 23.

The silicon-based solar cell module includes the electric cell section 21 formed using a silicon substrate as an electric cell layer. The electric cell section 21 is sealed with the sealing material 24 as in the electric cell layer in the compound-based solar cell module shown in the first example.

The back sheet 22, the cover glass 23, and the sealing material 24 are the same as those in the first example. Thus, a description thereof herein will be omitted.

<Recycling Method for Solar Cell Module>

An example of the recycling method of the solar cell module will be described.

FIRST EXAMPLE

The first example relates to a method for peeling off the substrate glass from the solar cell module with almost no sealing material left.

One of the technical problems in recycling a solar cell module is a method for effectively peeling off a sealing material from a cover glass. For example, as described above, the sealing material such as EVA has a role of preventing moisture, dust, or the like from entering the electric cell section when the cover glass and the electric cell section are embedded therein while closely adhered each other. That is to say, when more reliable sealing is realized, it is not easy to peel off the sealing material from the cover glass.

Thus, the present inventors have performed research concerning a way in which it is possible to peel off the sealing material from the cover glass with almost no sealing material left above the cover glass. As a result, to that end, the present inventors have found that a temperature of the solar cell module, specifically, a temperature at the interface between the cover glass and the sealing material and a force applied to the solar cell module at the time of peeling off the sealing material are important. The idea of peeling off the sealing material from the cover glass on the basis of a relationship between the temperature and the force is not present in the related art.

Figure 7:
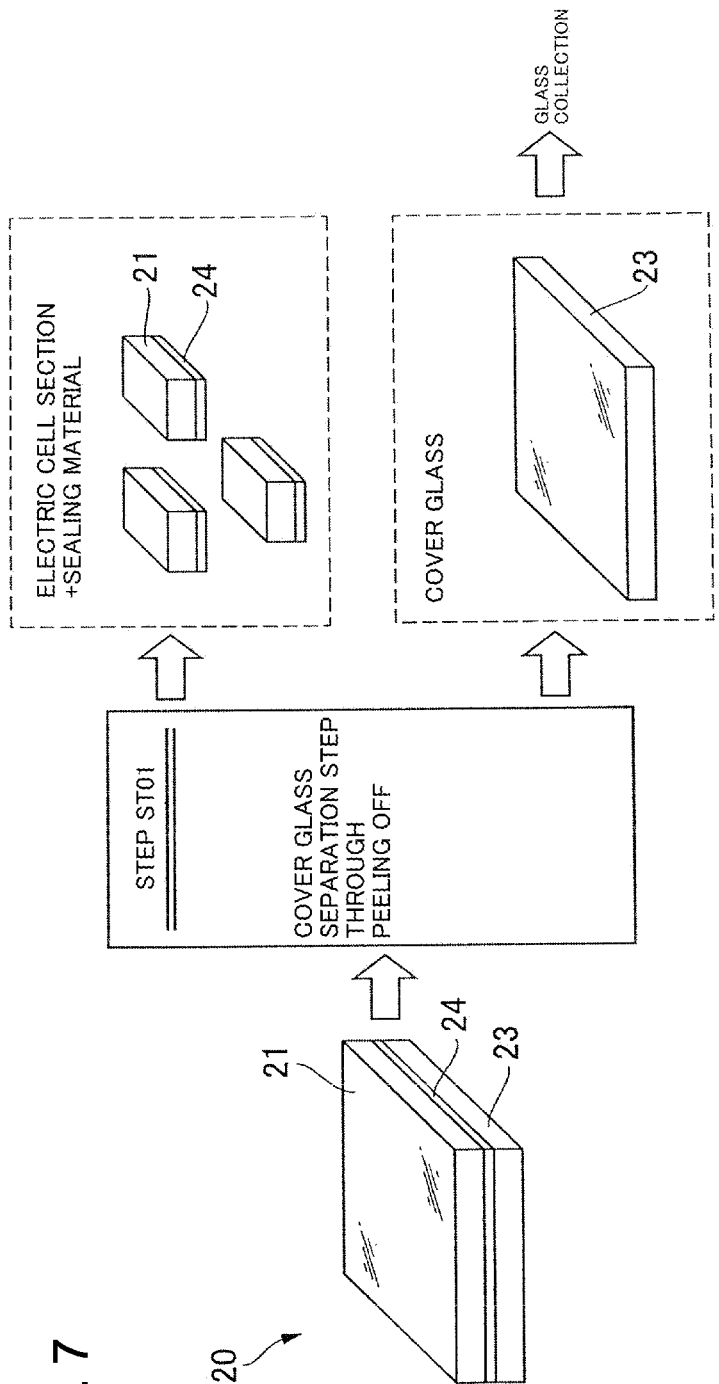
FIG. 7 is a diagram illustrating a first example of a recycling method.

FIG. 7 illustrates a first example of the recycling method for the solar cell module.

It is assumed that a solar cell module 20 to be recycled includes an electric cell section 21, a cover glass 23, and a sealing material 24 which closely adheres these.

As shown in FIG. 7, in this example, a cover glass separation step through peeling off is performed to separate the solar cell module 20 into the cover glass 23 and the electric cell section 21 and the sealing material 24 excluding the cover glass 23. Here, the cover glass separation step through the peeling off means a step of applying a force from the side surface of the solar cell module 20 to the electric cell section 21 in a state in which the interface between the cover glass 23 and the sealing material 24 is set to be within a prescribed temperature range and the interface is maintained at a prescribed temperature range (Step ST0101).

The interface between the cover glass 23 and the sealing material 24 is set to the prescribed temperature range to weaken an adhesive force between the cover glass 23 and the sealing material 24. Here, the sealing material 24 is not heated to a melting point at which it melts. In this example, the sealing material 24 is set to a softening temperature or higher and a melting temperature or lower. Furthermore, the reason why a force is applied to the electric cell section 21 is that this peels the cover glass 23 from the electric cell section 21 and the sealing material 24 using a portion to which the force is applied as a starting point.

In this way, according to the method in the first example, it is possible to easily and smoothly separate the cover glass 23 and the electric cell section 21 and the sealing material 24 excluding the cover glass 23. Furthermore, after this separation, the cover glass 23 is not crushed and hardly any of the sealing material 24 remains above the cover glass 23. That is to say, the sealing material 24 is not present above the cover glass 23 at all or a small amount of sealing material 24 remains on an edge of the cover glass 23.

As a result, according to the method in this example, as the cover glass 23 for recycling which is disassembled from the solar cell module 20, it is possible to provide the cover glass 23 in which a ratio of a weight of the sealing material 24 remaining on a glass main body to a weight of the glass main body is 9% or less. Here, the glass main body is the cover glass 23 to which the sealing material 24 does not adhere at all. Therefore, according to the method in this example, it is possible to effectively recycle the glass material from the cover glass 23 and to utilize the cover glass 23 again as it is.

Figure 8:
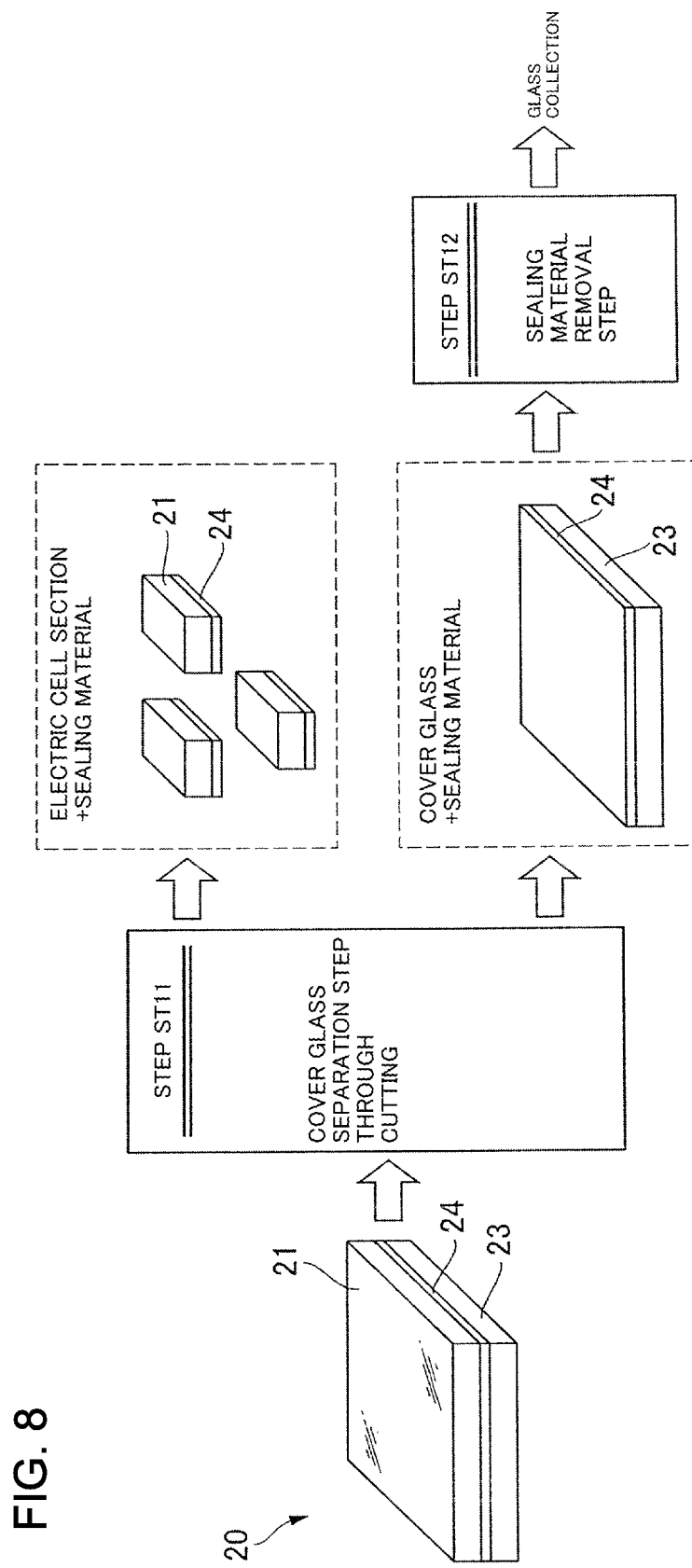
FIG. 8 is a diagram illustrating a comparative example of the recycling method.

FIG. 8 illustrates a comparative example of the recycling method for the solar cell module.

The comparative example relates to a technique for cutting a sealing material 24 using a blade because it is not easy to peel off the sealing material 24 from a cover glass 23. Constituent elements in FIG. 8 that are the same as those in FIG. 7 will be denoted by the same reference symbols. Thus, the comparison between the constituent elements in FIGS. 7 and 8 is facilitated.

In the related art, the electric cell section 21 and the cover glass 23 are generally separated using the cover glass separation step through cutting without peeling off the sealing material 24 from the cover glass 23. Here, the cover glass separation step through cutting is a step of separating the electric cell section 21 and the cover glass 23 by cutting the sealing material 24 using a blade (Step ST11).

However, in this case, a large amount of the sealing material 24 remains above the cover glass 23. Moreover, a large number of fine irregularities (embosses) are provided in a surface of the cover glass 23 to effectively guide sunlight to the electric cell section 21. That is to say, it is extremely difficult to physically remove the sealing material 24 remaining in a concave portion of the cover glass 23. Therefore, in the comparative example, it is necessary to further perform a sealing material removing step on the cover glass 23 obtained using the cover glass separation step through cutting (Step ST12).

The sealing material removing step is, for example, a step of firing the sealing material 24 at a high temperature for about 13 hours and thermally decomposing it. As a result, the recycling cost increases and the environmental load also increases due to the generation of $CO_2$.

As described above, as is clear from comparison of FIGS. 7 and 8, according to the first example of the recycling method for the solar cell module, it is possible to peel off the sealing material and the electric cell section from the cover glass on the basis of a temperature of the solar cell module and a force applied to the solar cell module. Therefore, according to this example, it is possible to realize a recycling technology of a solar cell module in which a material can be collected at low cost and high yield.

The first example of the recycling method for the solar cell module will be described in detail below with reference to FIGS. 9 to 13. Constituent elements in FIGS. 9 to 13 that are the same as those in FIGS. 1 to 8 which have already been described will be denoted by the same reference symbols. Thus, detailed description thereof will be omitted.

First, for example, the back sheet 22 is removed from the solar cell module 20 shown in FIG. 4 or 6. Subsequently, the solar cell module 20 is set to be within a prescribed temperature range, for example, a temperature of 40° C. or higher and 140° C. or lower using the heating device 11 in FIG. 1 or the heater 124 in FIG. 2. Thus, this weakens a bonding force between the cover glass 23 and the sealing material 24 in advance.

Figure 9:
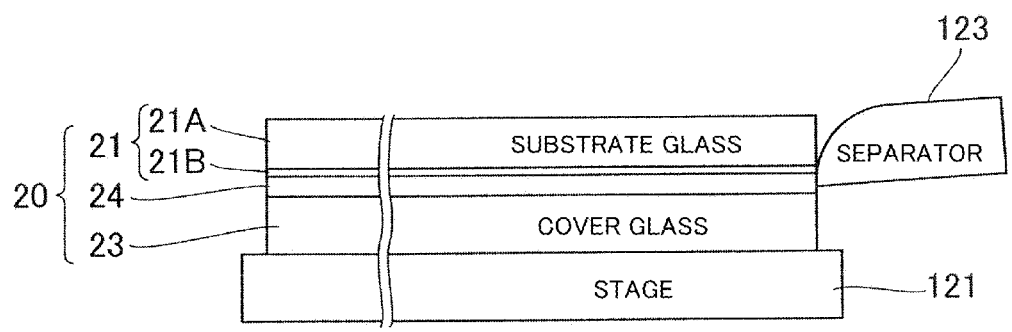
FIG. 9 is a diagram illustrating a separation state at a first time point in the method in FIG. 7.

Subsequently, as shown in FIG. 9, the separator 123 is pressed against the side surface of the solar cell module 20. For example, the solar cell module 20 is moved in a direction parallel to an upper surface of the stage 121 while the separator 123 has been stopped. As a result, the separator 123 is pressed against the side surface of the solar cell module 20. This time point is a first time point at which the separator 123 first comes into contact with the side surface of the solar cell module 20. At this time, the electric cell section 21, that is, the substrate glass 21A and the electric cell layer 21B, receives a force from the separator 123.

Figure 10:
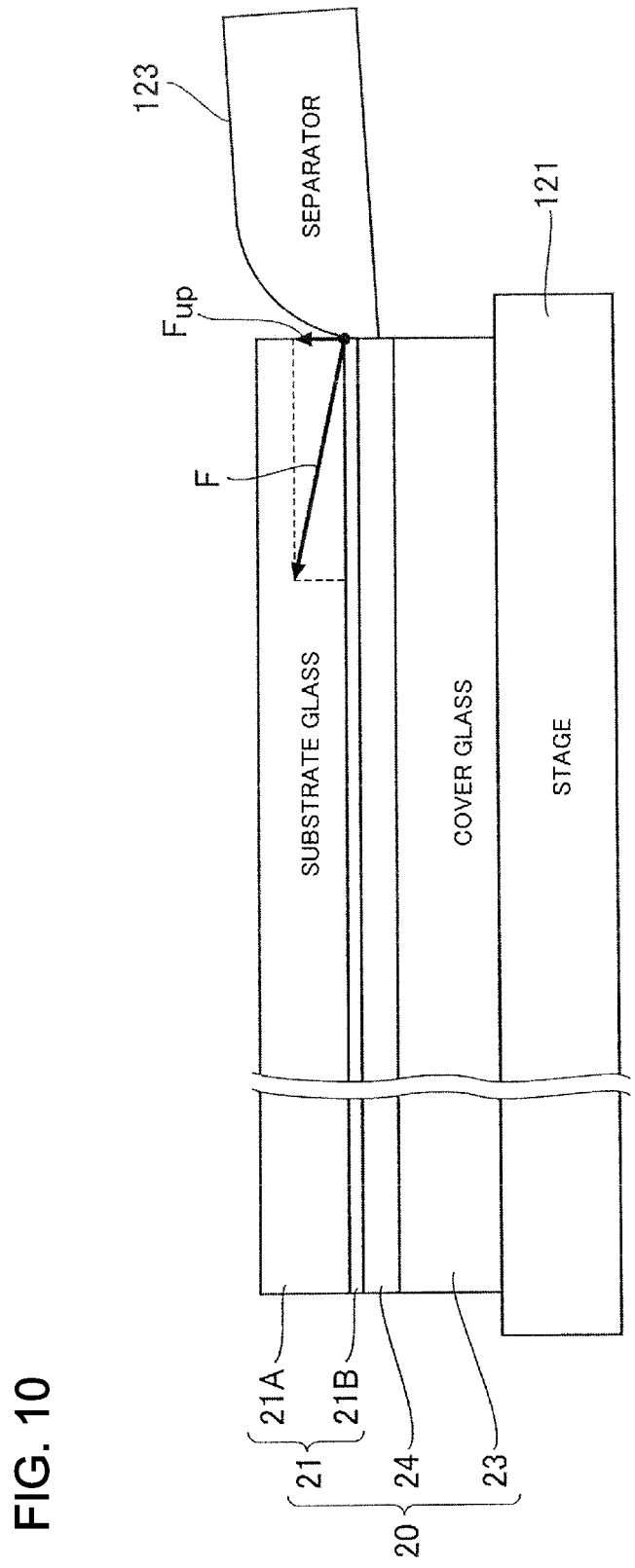
FIG. 10 is a diagram illustrating the separation state at the first time point in detail.

For example, as shown in FIG. 10, when the separator 123 includes a curved surface portion, if this curved surface portion comes into contact with the electric cell section 21, the electric cell section 21 receives a force F from the separator 123. A part of this force F is a force Fup for peeling off the electric cell section 21 from the cover glass 23 together with the sealing material 24. Therefore, as shown in FIG. 11, the electric cell section 21 and the sealing material 24 are peeled off from the cover glass 23 using a contact portion between the separator 123 and the electric cell section 21 as a starting point.

Figure 11:
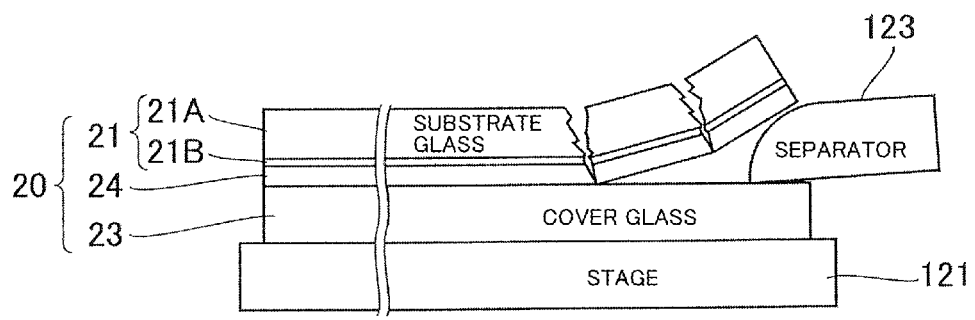
FIG. 11 is a diagram illustrating a separation state at a second time point in the method in FIG. 7.

Here, as shown in FIG. 11, the electric cell section 21 is peeled off from the cover glass 23 while crushed. Therefore, as shown in FIG. 7, the electric cell section 21 and the sealing material 24 which have been separated from the cover glass 23 serve as glass cullet. A method for collecting a material in the electric cell section 21 and the sealing material 24 from this glass cullet will be described later.

Figure 12:
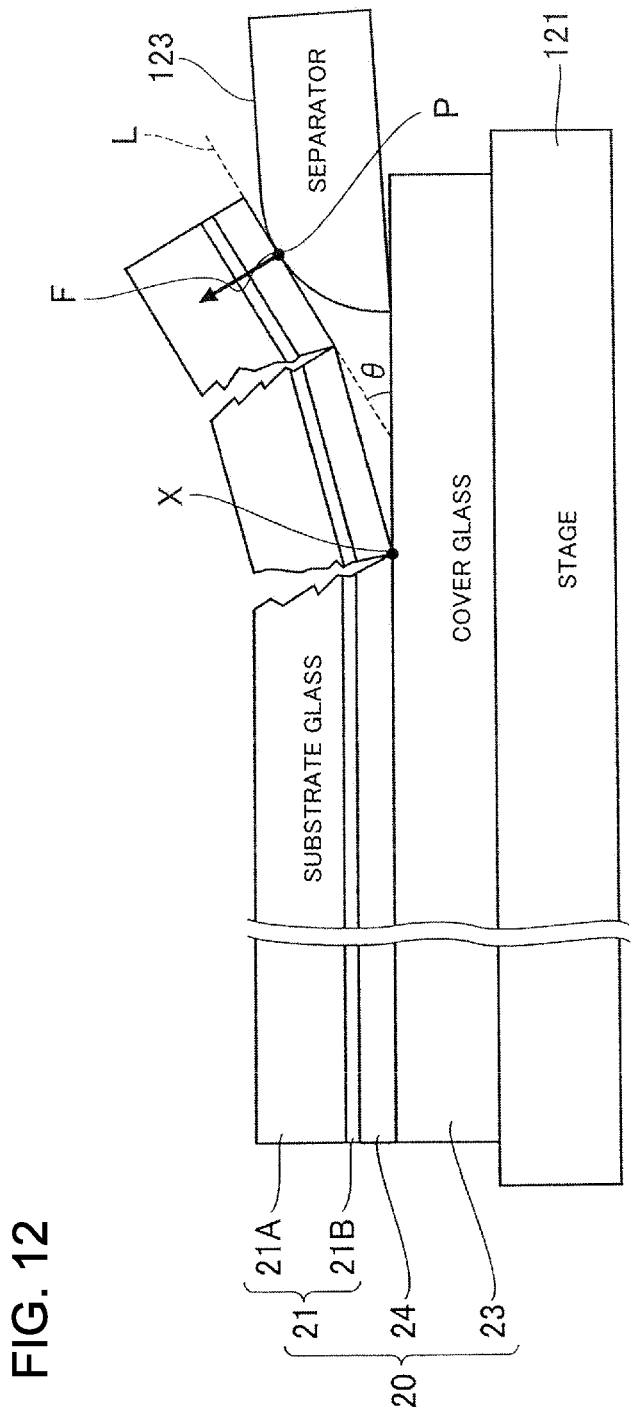
FIG. 12 is a diagram illustrating the separation state at the second time point in detail.

Also, as shown in FIG. 11, if the separator 123 enters between the electric cell section 21 and the cover glass 23, the contact portion between the separator 123 and the electric cell section 21 also changes. This time point is a second time point other than the above-described first time point. At this time, as shown in FIG. 12, at a contact portion P, the electric cell section 21 receives the force F from the separator 123. Furthermore, it is desirable that an angle (a contact angle) $\theta$ formed by a tangent line L at the contact portion P and the surface of the cover glass 23 be, for example, 36° or more and 51° or less. The basis for this will be described later.

Also, at the second time point, the separator 123 does not come into contact with a boundary section X in which the cover glass 23 and the sealing material 24 are separated.

A separation state in the comparative example in FIG. 8 will be described in brief below.

Figure 13:
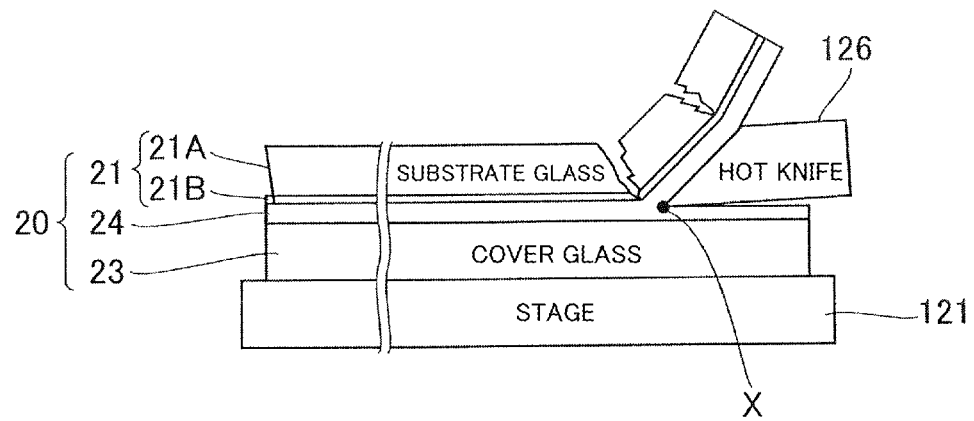
FIG. 13 is a diagram illustrating a separation state in the method in FIG. 8.

As shown in FIG. 13, in the comparative example, the electric cell section 21 and the cover glass 23 are separated using a blade (for example, a hot knife) 126. This separation is performed by cutting the sealing material 24 using the blade 126. At this time, the blade 126 comes into contact with the boundary section X in which the cover glass 23 and the sealing material 24 are separated at all times.

In this way, when a solar cell panel 20 is sent out toward the separator 123 with the cover glass 23 facing downward and the side surface of the solar cell panel 20 is pressed against the separator 123, only the cover glass 23 remains above the stage 121 and flows as it is and the electric cell section 21 and the sealing material 24 excluding the cover glass 23 are separated from the cover glass 23 as glass cullet.

Also, since the sealing material 24 hardly remains above the cover glass 23, it is possible to collect the cover glass 23 in a short time and at low cost. Furthermore, it is also possible to utilize the cover glass 23 again as it is.

If the method in this example is used, it is possible to obtain the effect in which an amount of the sealing material 24 remaining above the cover glass 23 can be reduced as compared with the related art. Here, the amount of the sealing material 24 remaining above the cover glass 23, that is, a degree of the effect of the method in this example, changes in accordance with various parameters (a module temperature, a contact angle of the separator, a transportation speed of the solar cell module, a separator temperature, and the like). This will be described later.

EXPERIMENTAL EXAMPLE

An example of parameters in which a degree of the effect associated with the above-described first example is determined will be described below. The numerical limitations on the parameters which will be described below are based on experimental results. The solar cell module to be recycled is used as a CIS-based solar cell module which is a typical example of the compound-based solar cell module and has the structure shown in FIG. 4 (here, has a state in which the back sheet 22 has been removed).

[Module Temperature]

Figure 14:
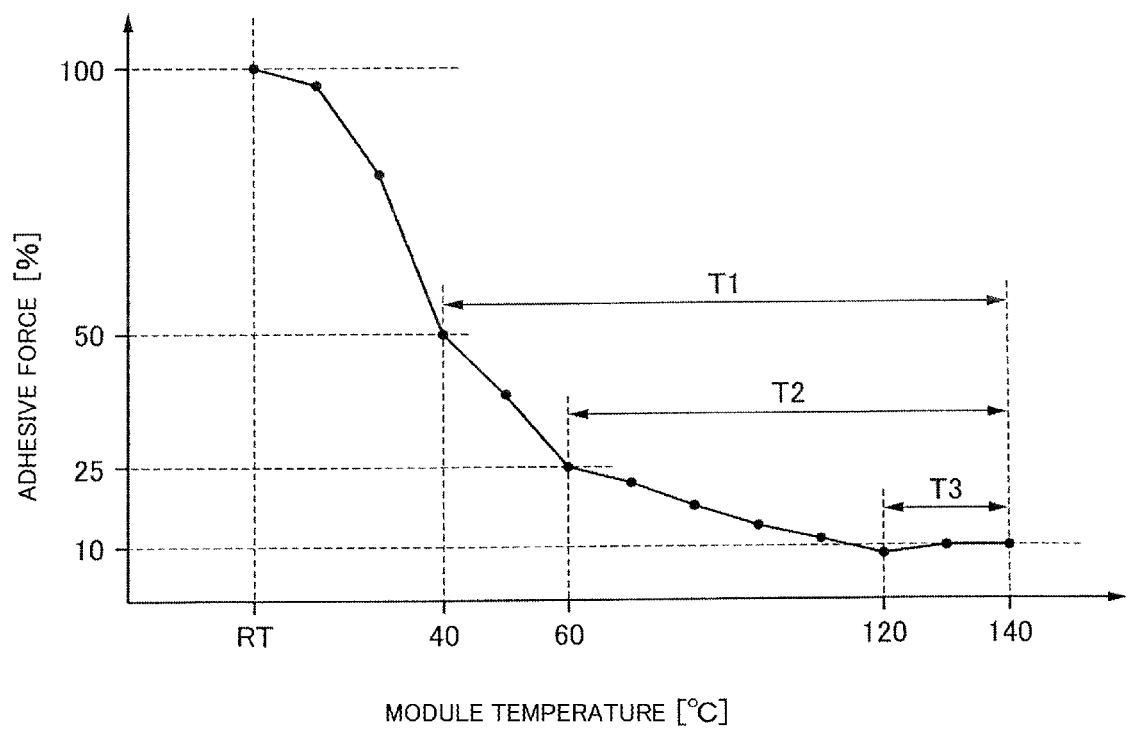
FIG. 14 is a diagram illustrating a relationship between a module temperature and an adhesive force of the sealing material.

FIG. 14 illustrates a relationship between a module temperature and an adhesive force of a sealing material.

The sealing material has a role of firmly and closely adhering the cover glass and the electric cell section at room temperature (RT) to prevent moisture, dust, and the like from entering the electric cell section. Therefore, here, assuming that the adhesive force of the sealing material is set as 100% at room temperature, for example, at about 20° C., the contents of a way in which this adhesive force changes in accordance with the module temperature is verified.

According to FIG. 14, it can be seen that the adhesive force of the sealing material, that is, the adhesive force with respect to the cover glass, decreases when the module temperature, that is, the temperature at the interface between the cover glass and the sealing material increases. Here, the sealing material is EVA. For example, if the module temperature reaches 40° C., the adhesive force of the sealing material is reduced to about half (about 50%) of the adhesive force at room temperature. Furthermore, if the module temperature reaches 60° C., the adhesive force of the sealing material is reduced to about 25% of the adhesive force at room temperature. In addition, if the module temperature reaches 120° C., the adhesive force of the sealing material is reduced to about 10% of the adhesive force at room temperature.

Although it is desirable to decrease the adhesive force of the sealing material in the cover glass separation step through peeling off described above, generally, if the adhesive force of the sealing material is 50% or less of the adhesive force at room temperature, as will be described later, it is possible to collect the cover glass which does not hinder the recycling of glass materials. Here, the cover glass which does not hinder the recycling of the glass material means the cover glass in which a weight ratio of the remaining sealing material is 9% or less. Furthermore, the weight ratio of the remaining sealing material is defined as $(B/A) \times 100$ "%" when a weight of the cover glass is assumed to be A and a weight of the sealing material remaining above the cover glass is assumed to be B.

Therefore, when the sealing material is EVA, the module temperature is preferably 40° C. or higher to collect the cover glass without any problem. Furthermore, as described above, the sealing material needs to have a softening temperature or higher and a melting temperature or less. Considering this point, in the case of EVA, the module temperature is preferably 140° C. or lower. As a result, when the module temperature is with the range of T1, that is, 40° C. or higher and 140° C. or lower, the effect in which the cover glass can be easily collected is obtained.

Also, when the sealing material is EVA, the module temperature is preferably within the range of T2, that is, 60° C. or higher and 140° C. or lower, to collect the cover glass without any further problem. In addition, as will be described later, in order to realize the cover glass in which the weight ratio of the remaining sealing material is 3% or less and to obtain the maximum effect of the cover glass separation step through peeling off described above, the module temperature is preferably within the range of T3, that is, 120° C. or higher and 140° C. or less.

The contents of a way in which the weight ratio of the remaining sealing material as an index indicating the above-described effect associated with the first example changes in accordance with other parameters other than the module temperature is verified.

[Contact Angle of Separator]

Figure 15:
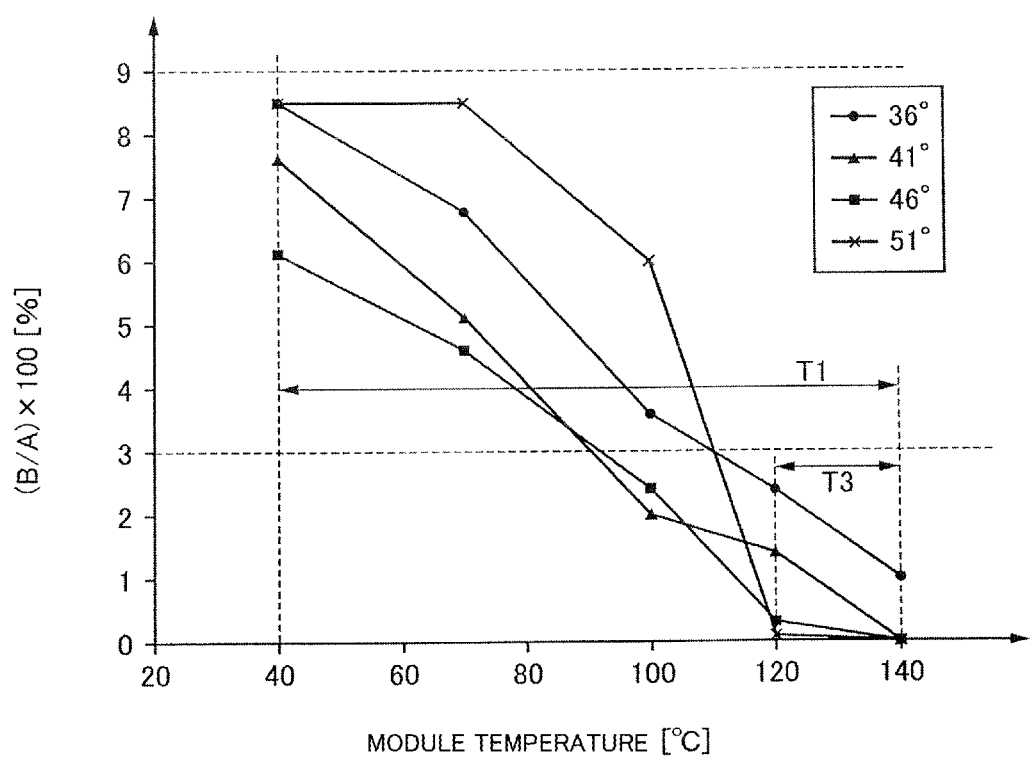
FIG. 15 is a diagram illustrating a relationship between a contact angle of a separator and the remaining sealing material.

FIG. 15 illustrates a relationship between a contact angle of a separator and the remaining sealing material.

The contact angle of the separator is an angle formed by a tangent line at the contact portion between the separator and an electric cell section and a surface of the cover glass (or a surface of the stage). For example, as shown in FIG. 12, an angle θ formed by the tangent line L at the contact portion P and the surface of the cover glass 23 is defined as the contact angle of the separator.

The contact angle of the separator can be changed by changing a shape of the separator, particularly, a shape of the curved surface portion, or by changing the angle of the separator when the side surface of the solar cell module is pressed against the separator. Furthermore, the angle of the separator when the side surface of the solar cell module is pressed against the separator can be easily changed, for example, when the separator 123 is rotatable about the rotation axis O as shown in FIG. 1.

In FIG. 15, a horizontal axis represents a module temperature [° C.] and a vertical axis represents a weight ratio $(B/A) \times 100[\%]$ of the remaining sealing material. Moreover, within the range Ti of the module temperature (40° C.≤T1≤140° C.) in which the above-described effect of the first example can be obtained, FIG. 15 shows that the contact angle of the separator required to reduce the weight ratio of the remaining sealing material to 9% or less is verified.

Four types of contact angles of the separator (36°, 41°, 46°, and 51°) are prepared. According to FIG. 15, it can be seen that the weight ratio of the remaining sealing material is 9% or less when the contact angle of the separator is 36° or more and 51° or less. Furthermore, according to FIG. 15, it can be seen that the weight ratio of the remaining sealing material is the largest at a point in which the module temperature is the lowest (40° C.). Moreover, at the module temperature of 40° C., contact angles of the separator having the largest weight ratio of the remaining sealing material are 36° (a minimum value) and 51° (a maximum value).

That is to say, if the contact angle of the separator is less than 36° or more than 51°, it is easily predicted that the weight ratio of the remaining sealing material is likely to be more than 9% within the range T1 of the module temperature. Therefore, in order to obtain the effect in which the weight ratio of the remaining sealing material is 9% or less within the range T1 of the module temperature, the contact angle of the separator is preferably 36° or more and 51° or less.

Also, as described with reference to FIG. 14, the module temperature has an effect of minimizing the adhesive force of the sealing material (EVA) within the range T3 of 120° C. or more and 140° C. or less. Thus, in FIG. 15, when the contents of the weight ratio of the remaining sealing material in accordance with the contact angle of the separator within the temperature range of T3 are reviewed, it can be seen that the contact angle of the separator is 36° or more and 51° or less and the weight ratio of the remaining sealing material can be 3% or less. Therefore, in order to obtain the effect in which the weight ratio of the remaining sealing material is 3% or less within the range T3 of the module temperature, the contact angle of the separator is preferably 36° or more and 51° or less.

[Other Parameters]

Parameters which determine a degree of the above-described effect associated with the first example include a transportation speed of the solar cell module, a separator temperature, and the like, in addition to the module temperature and the contact angle of the separator.

When the solar cell module is recycled, as described above, a relative speed between the solar cell module and the separator is set to a prescribed speed range in the direction parallel to the surface of the cover glass and the side surface of the solar cell module is pressed against the separator. Thus, the prescribed speed range, for example, a relationship between the transportation speed of the solar cell module (when the separator is stopped) and the weight ratio of the remaining sealing material is verified. As a result, in order to obtain the effect in which the weight ratio of the remaining sealing material is 9% or less within the range T1 of the module temperature, the transportation speed of the solar cell module can be, for example, 24 mm/s or less (here, excluding 0 mm/s).

That is to say, it is found that, when the transportation speed of the solar cell module decreases, in order words, a speed in which the sealing material is peeled off from the cover glass decreases, an amount of sealing material remaining above the cover glass is reduced. However, if the transportation speed of the solar cell module is slow, a concern that the throughput in recycling may deteriorate occurs. Thus, considering this throughput, the transportation speed of the solar cell module can be set to, for example, 3 mm/s or more and 24 mm/s or less.

The separator temperature also affects the weight ratio of the remaining sealing material. However, as verified by experiments, the separator temperature does not affect the weight ratio of the remaining sealing material unless it becomes extremely large. For example, if the separator temperature acts to worsen the peel off of the sealing material from a time at which the separator temperature has exceeded about 140° C. and exceeds about 200° C., the weight ratio of the remaining sealing material extremely increases. It is conceivable that, this is partly because the separation of acetic acid in the sealing material (EVA) occurs if the separator temperature exceeds about 140° C.

Therefore, the separator temperature is preferably 140° C. or less, as in the module temperature. As described above, this is consistent with that the weight ratio of the remaining sealing material can be 9% or less when the module temperature is 140° C. or less. Here, a role of the separator is to peel off the electric cell section from the cover glass together with the sealing material and the adhesive force of the sealing material is adjusted using the module temperature. That is to say, it is sufficient for the separator temperature to be maintained at room temperature and this is preferable from the viewpoint of the controllability of the recycling method and the effect of this embodiment.

As described above, according to the first example, it is possible to easily collect the cover glass which does not hinder the recycling of the glass material. That is to say, according to the first example, it is possible to realize a recycling technique for a solar cell module in which a material can be collected at low cost and high yield.

SECOND EXAMPLE

A second example relates to the overall flow of a recycling method for a solar cell module including the above-described method associated with the first example. The second example is a technique for collecting all of the materials constituting the solar cell modules to be recycled from the solar cell modules with high yield, low cost, and low environmental load.

The recycling method associated with the second example is characterized by having the following three steps:

1) Cover glass separation step (Step ST01)
2) Lift-off step (Step ST02)
3) Extraction step (Step ST03).

The cover glass separation step (Step ST01) corresponds to the cover glass separation step in which the peeling off which has already been described with reference to FIGS. 7 and 9 to 12 is used. In this step, the solar cell module is separated into the cover glass and the glass cullet other than the cover glass (the electric cell section and the sealing material). Furthermore, the lift-off step (Step ST02) is a step of collecting the substrate glass and the sealing material from the glass cullet by dissolving the electric cell layer in the electric cell section using a solution. In addition, the extraction step (Step ST03) is a step of collecting various materials included in the solution by extracting various materials included in the solution from the solution including the dissolved electric cell layer.

The lift-off step (Step ST02) and the extraction step (Step ST03) are referred to as a "liquid phase recycling step" because they use the solution.

Figure 16:
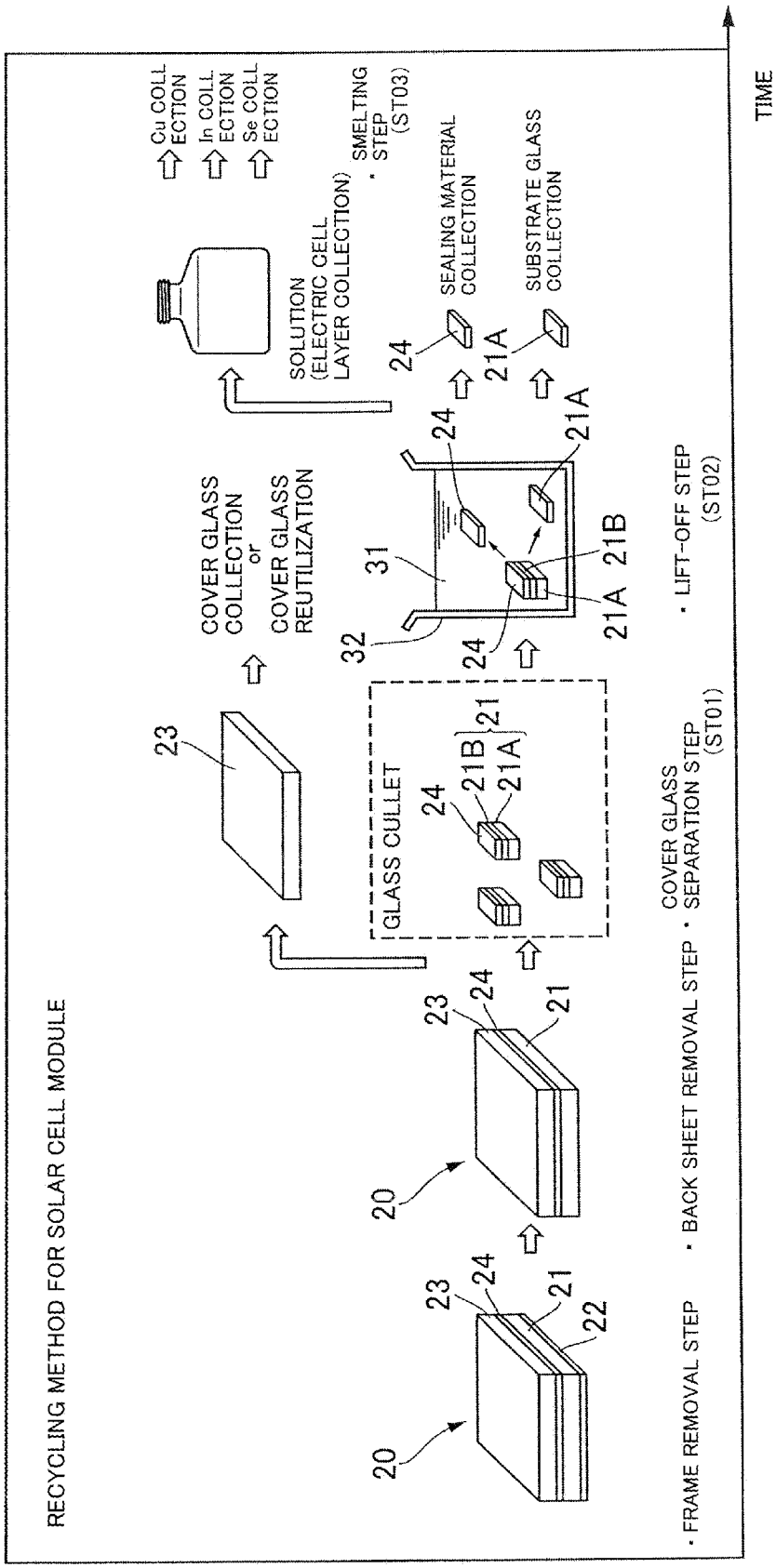
FIG. 16 is a diagram illustrating a second example of the recycling method.

The recycling method for the solar cell module associated with the second example will be described below with reference to FIG. 16. The solar cell module to be recycled is a CIS-based solar cell module and has a structure shown in FIG. 4 (here, having a state in which a frame (not shown) is included).

First, the frame is removed from the solar cell module 20 to be recycled using a frame removal step. Here, the frame includes a material such as aluminum or an aluminum alloy. Subsequently, the back sheet is peeled off from the solar cell module 20 using a back sheet removal step. The frame removal step and the back sheet removal step are performed using a known method.

Subsequently, the cover glass 23 is peeled off from the solar cell module 20 using the cover glass separation step (Step ST01). In the cover glass 23 obtained through this step, as described above, for example, a ratio of a weight of the sealing material 24 remaining on the glass main body to a weight of the glass main body is 9% or less. Therefore, an amount of the sealing material remaining on the cover glass 23 is small, and as a result, it is possible to effectively recycle the glass material from the cover glass 23 and to utilize the cover glass 23 again as it is.

On the other hand, the glass cullet other than the cover glass 23 obtained through the cover glass separation step includes the electric cell section 21 and the sealing material 24. Furthermore, the electric cell section 21 includes, for example, the substrate glass 21A and the electric cell layer 21B. As shown in FIG. 5, the electric cell layer 21B includes, for example, the first electrode layer 211, the photoelectric conversion layer 212, the buffer layer 213, and the second electrode layer 214. The photoelectric conversion layer 212 includes, for example, $Cu(In_x, Ga_{1-x})(Se_{1-y})_2$, where $0 \leq x \leq 1$ and $0<y<1$. When the photoelectric conversion layer 212 which is a main part of the electric cell layer 21B includes Cu, In, and Se, the electric cell layer 21B is generally referred to as a "CIS type."

In this way, the glass cullet has a state in which the broken substrate glass 21A, the electric cell layer 21B, and the sealing material 24 closely adhere each other. Thus, the glass cullet dissolves the electric cell layer 21B using a solution 31 through the lift-off step (Step ST02) and thus the solution 31 including the broken substrate glass 21A, the sealing material 24, and the dissolved electric cell layer 21B are separated.

For example, when the solution 31 is a nitric acid solution, for example, the CIS-type electric cell layer 21B is dissolved in the nitric acid solution. On the other hand, since the substrate glass 21A and the sealing material 24 having the electric cell layer 21B arranged therebetween are not dissolved in the nitric acid solution, the substrate glass 21A and the sealing material 24 are separated from each other as solids (the lift-off step). Furthermore, since the substrate glass 21A is heavy, the substrate glass 21A is sunk at a bottom portion of a tank 32 of the nitric acid solution. In addition, since the sealing material 24 is light, a state in which the sealing material 24 floats at an upper portion of the tank 32 of the nitric acid solution is provided.

Therefore, the substrate glass 21A and the sealing material 24 are separated from each other and collected separately through the lift-off step of immersing the glass cullet in the solution 31. Furthermore, the CIS-type electric cell layer 21B is collected in a state of being dissolved in the solution 31 through the lift-off step (the liquid phase recycling step).

Finally, the extraction step (Step ST03) is performed to collect various materials from the solution 31 from which the substrate glass 21A and the sealing material 24 have been removed. When copper (Cu), indium (In), selenium (Se), gallium (Ga), sulfur (S), zinc (Zn), and the like included in the CIS-type electric cell layer 21B are sequentially collected through this extraction step, it is possible to realize a collection rate of 90% or more.

In the related art, the CIS-type electric cell layer has been collected, for example, by polishing the electric cell layer and converting it into powders (a powder collection step). A collection rate of various materials through this powder collection step has a limit in improving the purity thereof due to the nature of the powders and are 1% or less. In view of such circumstances, the liquid phase recycling step can be referred to as a "very excellent technique" because the collection rate of various materials included in the electric cell layer is improved in each stage.

Also, since selenium is a harmful substance, it is desirable to collect selenium at a high collection rate in the liquid phase recycling step from the viewpoint of non-diffusion of harmful substances. In addition, in the liquid phase recycling step, a chemical solution obtained by dissolving the CIS-type electric cell layer 21B, for example, a nitric acid solution, is used as the solution 31. This means that, for example, it is not necessary to utilize an organic solvent for dissolving the sealing material 24 such as EVA.

According to the above-described recycling method for the solar cell module in which the cover glass separation step, the lift-off step, and the extraction step are utilized, the recycling cost required to collect various materials can be 40 yen/kg or less, specifically about 34 yen/kg. In the case of the technique in the related art (FIG. 8+the powder collection step), if the recycling cost required to collect various materials is about 57 yen/kg, the method associated with the second example is also very effective in terms of recycling cost.

A numerical value of about 34 yen/kg is equivalent to 4.1 yen/W when converted into the cost per 1 W of rated output of the solar cell module. That is to say, assuming that the production cost per 1 W of rated output of a solar cell panel is 60 to 70 yen/W, the recycling cost can be 10% or less of the production cost.

<Conclusion>

As described above, according to the embodiments of the present invention, it is possible to realize a recycling technique of a solar cell module in which a material can be collected at low cost and high yield.

That is to say, according to the cover glass separation step, since it is possible to collect the cover glass at low cost and high yield and a firing/decomposition step of the sealing material is not required, it is also possible to reduce the environmental load without emission of $CO_2$. Furthermore, according to the lift-off step, since it is possible to collect the substrate glass at low cost and high yield and an organic solvent is not utilized, it is also possible to improve the safety. In addition, according to the lift-off step, since the sealing material is not decomposed, it is also possible to collect the sealing material. Moreover, according to the extraction step, when various materials are chemically taken out from the solution, it is possible to collect various materials included in the electric cell layer at low cost and high yield and to realize the effect of non-diffusion of harmful substances.

Although some embodiments of the present invention have been described, these embodiments are presented as examples and are not intended to limit the scope of the present invention. These embodiments can be implemented in various modes other than those described above and various omissions, substitutions, changes, and the like can be provided without departing from the gist of the present invention. These embodiments and modifications thereof are included in the scope and the gist of the present invention and the inventions described in the claims and equivalents thereof are also included in the scope and the gist of the present invention.

REFERENCE SIGNS LIST

10 Recycling device of solar cell module
11 Heating device
12 Separating device
121 Stage
122 Drive unit
123 Separator
124 Heater
125 Roller
126 Blade
13 Control unit
20 Solar cell module
21 Electric cell section
21A Substrate glass
21B Electric cell layer
211 First electrode layer
212 Photoelectric conversion layer
213 Buffer layer
214 Second electrode layer
22 Back sheet
23 Cover glass
24 Sealing material
31 Solution
32 Tank

The invention claimed is:

1. A recycling method for a solar cell module which includes a cover glass, an electric cell layer, and a sealing material which closely adheres the cover glass and the electric cell layer, comprising:
   heating an interface between the cover glass and the sealing material to a prescribed temperature range; and
   applying a force from a side surface of the solar cell module to the sealing material with the interface maintained at the prescribed temperature range, to peel off the sealing material and the electric cell layer from the interface,
   wherein the force is applied by pressing a separator against the sealing material from the side surface, and
   wherein the separator does not come into contact with a boundary portion in which the cover glass and the sealing material are separated at a second time point other than a first time point at which the separator first comes into contact with the side surface of the solar cell module.

2. The recycling method for a solar cell module according to claim 1, wherein the prescribed temperature range is a softening temperature or higher and a melting temperature or lower of the sealing material.

3. The recycling method for a solar cell module according to claim 2, wherein the sealing material is EVA, and
   the prescribed temperature range is 40° C. or higher and 140° C. or lower.

4. The recycling method for a solar cell module according to claim 1, wherein the electric cell layer is a CIS-type electric cell layer.

5. The recycling method for a solar cell module according to claim 1, wherein, after the sealing material and the electric cell layer are peeled off from the cover glass, a weight of the sealing material remaining on the cover glass is 9% or less of a weight of the cover glass.

6. The recycling method for a solar cell module according to claim 1, wherein, when the electric cell layer is arranged above a substrate glass and a solar cell module having a structure in which the electric cell layer is arranged between the cover glass and the substrate glass is provided, the sealing material, the electric cell layer, and the substrate glass are peeled off from the cover glass while the substrate glass is crushed by applying the force to the substrate glass.

7. The recycling method for a solar cell module according to claim 6, wherein the substrate glass and the sealing material are collected separately by immersing the sealing material, the electric cell layer, and the substrate glass which have been peeled off from the cover glass in a solution, dissolving the electric cell layer, and separating the substrate glass and the sealing material.

8. The recycling method for a solar cell module according to claim 7, wherein the substrate glass and the sealing material are collected separately using a weight difference between the substrate glass and the sealing material in the solution.

9. The recycling method for a solar cell module according to claim 8, wherein the solution is a nitric acid solution.

10. The recycling method for a solar cell module according to claim 7, wherein, after the substrate glass and the sealing material are collected from the solution, each material included in the electric cell layer is collected through extraction from the solution.

11. The recycling method for a solar cell module according to claim 10, wherein the separator has a contact portion in which the separator comes into contact with the sealing material at the second time point, and
an angle formed by a tangent line of the contact portion and a surface of the cover glass is 36° or more and 51° or less.

12. The recycling method for a solar cell module according to claim 10, wherein, in a direction parallel to the surface of the cover glass, a relative speed between the solar cell module and the separator is within a prescribed speed range and the side surface of the solar cell module is pressed against the separator, to generate the force.

13. The recycling method for a solar cell module according to claim 10, wherein a temperature of the separator is maintained at room temperature.

* * * * *